(12) United States Patent
Buck

(10) Patent No.: US 6,924,071 B1
(45) Date of Patent: Aug. 2, 2005

(54) PHOTOMASK AND METHOD FOR REDUCING EXPOSURE TIMES OF HIGH DENSITY PATTERNS ON THE SAME

(75) Inventor: Peter Buck, Aloha, OR (US)

(73) Assignee: Toppan Photomasks, Inc., Round Rock, TX (US)

( * ) Notice: Subject to any disclaimer, the term of this patent is extended or adjusted under 35 U.S.C. 154(b) by 247 days.

(21) Appl. No.: 09/996,333

(22) Filed: Nov. 28, 2001

Related U.S. Application Data

(60) Provisional application No. 60/253,532, filed on Nov. 28, 2000, provisional application No. 60/254,221, filed on Dec. 8, 2000.

(51) Int. Cl.[7] ................................................ G03F 9/00
(52) U.S. Cl. ................... 430/30; 430/5; 430/22
(58) Field of Search ................................. 430/22, 5, 30

(56) References Cited

U.S. PATENT DOCUMENTS

| | | | |
|---|---|---|---|
| 5,885,734 A | 3/1999 | Pierrat et al. ................... | 430/5 |
| 6,284,413 B1 * | 9/2001 | Adams ........................... | 430/5 |

* cited by examiner

*Primary Examiner*—Mark F. Huff
*Assistant Examiner*—Saleha Mohamedulla
(74) *Attorney, Agent, or Firm*—Baker Botts L.L.P.

(57) ABSTRACT

A method for reducing exposure times for high density patterns on a photomask is disclosed. The method includes moving a selected feature located in a cell between a first boundary and a second boundary from a first pattern file to a second pattern file and exposing a resist layer of a photomask blank with the first pattern file by using a step and repeat technique.

23 Claims, 5 Drawing Sheets

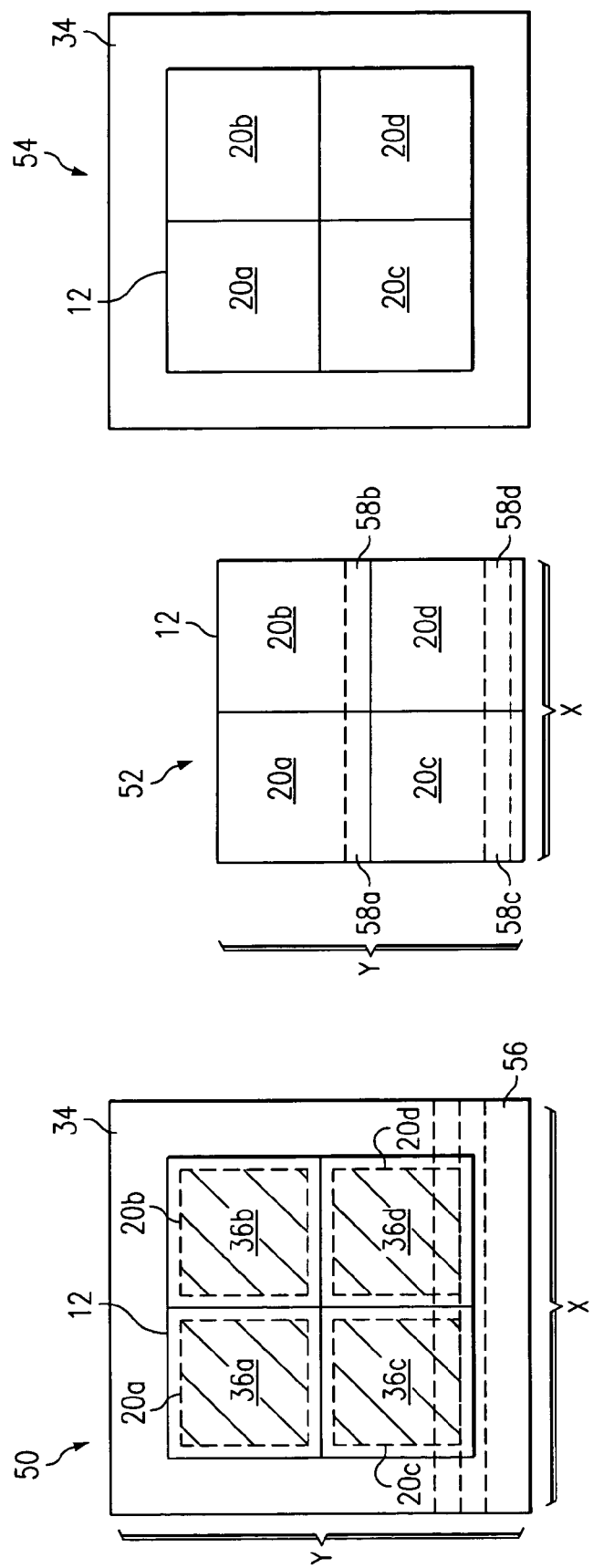

PHOTOMASK AND METHOD FOR REDUCING EXPOSURE TIMES OF HIGH DENSITY PATTERNS ON THE SAME

CROSS REFERENCE TO RELATED APPLICATION

This application claims priority from U.S. Provisional Patent Application Ser. No. 60/253,532, filed Nov. 28, 2000, and entitled "Strategy to Reduce Write Times for High Density Mask Layers with Repetitive Cell Structure," and U.S. Provisional Patent Application Ser. No. 60/254,221, filed Dec. 8, 2000, and entitled "Method to Reduce Mask Exposure Time for High Density Mask Layers with Repetitive Cell Structure and Optical Proximity Correction."

TECHNICAL FIELD OF THE INVENTION

This invention relates in general to photolithography and, more particularly, to a photomask and method for reducing exposure times of high density patterns on the same.

BACKGROUND OF THE INVENTION

Advances in integrated circuit (IC) design and the manufacturing techniques used to create ICs have contributed to reducing the size of design features in the ICs. Since the number of features in a pattern directly corresponds to the size of a data file, an increase in the number of features in a pattern also increases the size and complexity of the data file.

Patterns in the data file are typically imaged onto the surface of a photomask or a reticle by a lithography tool that compiles the patterns contained in the data file and prints the compiled patterns onto the photomask. The size of the data file does not affect the printing speed of the lithography tool but a larger data file can increase the amount of time needed for compilation. For example, if the volume of patterns in the data file increases above the processing limit of the lithography tool, the processing resources of the lithography tool cannot keep up with the printing system and the tool must pause during printing to wait for more data to be processed. A large data file, therefore, can decrease the throughput of the lithography tool and increase the cost of manufacturing a photomask.

SUMMARY OF THE INVENTION

In accordance with the teachings of the present invention, disadvantages and problems associated with reducing exposure times of high density patterns on a photomask have been substantially reduced or eliminated. In a particular embodiment, a method for reducing exposure times of high density patterns on a photomask is disclosed that moves a selected feature from a first pattern file to a second pattern file and images the first pattern file into a resist layer of a photomask blank using a step and repeat technique.

In accordance with one embodiment of the present invention, a method for reducing exposure times of high density patterns on a photomask includes moving a selected feature that is located in a cell between a first boundary and a second boundary from a first pattern file to a second pattern file. A resist layer of a photomask blank is exposed with the first pattern file by using a step and repeat technique.

In accordance with another embodiment of the present invention, a method for fabricating a photomask includes providing a photomask blank that includes a resist layer and moving a plurality of optical proximity correction (OPC) features that are respectively located in a plurality of cells in an array between an outer boundary and an inner boundary from a first pattern file to a second pattern file. The method processes data associated with a selected one of the cells from the first pattern file and divides the selected cell into a plurality of sections. Each of the sections is exposed in the selected cells and the process is repeated for each of the cells in the array. The resist layer is further exposed with a second pattern file and the resist layer is developed to form the array with the OPC features on the photomask blank.

Important technical advantages of certain embodiments of the present invention include a lithographic technique that reduces processing and exposure time for mask layers that include highly repetitive cell structures. A structure, such as an array on a semiconductor device, may include multiple instances of a cell that contains a large number of features. The features in each cell may require optical proximity correction (OPC), which can increase the size of the mask pattern file. In order to decrease the size of the mask pattern file, cell-to-cell OPC that is unique to the location of the cell in the array may be moved out of the mask pattern file. Processing time for the mask pattern file may be reduced by using a step and repeat technique to form substantially identical cells into a resist layer of a photomask blank.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein:

FIGS. 5A through 5C illustrate a step and repeat technique for imaging the cell array into the resist layer of the photomask blank by using the frame pattern file and the cell pattern file.

DETAILED DESCRIPTION OF THE INVENTION

Preferred embodiments of the present invention and their advantages are best understood by reference to FIGS. 1 through 5, where like numbers are used to indicate like and corresponding parts.

A photomask is a crucial component of a lithography tool because it serves as the template that images a complex geometry, such as an integrated circuit (IC), on a wafer. Each IC may be formed by a combination of patterns that include multiple design features. As the dimensions of the design features decrease, the number of features that may be included in a single pattern increases. The size of a mask pattern file used to image the patterns on the photomask corresponds to the number of features in the pattern. Since the compilation time of a mask data file and throughput of a lithography tool are related to the size of the data file, the lithography tool requires more time to print high density patterns into the resist layer of a photomask. In a particular embodiment, the present invention provides a method for reducing exposure times of high density patterns on a photomask by moving a selected feature from a first pattern file into a second pattern file and exposing a resist layer of a photomask blank with the first pattern file by using a step and repeat technique.

Figure 1:
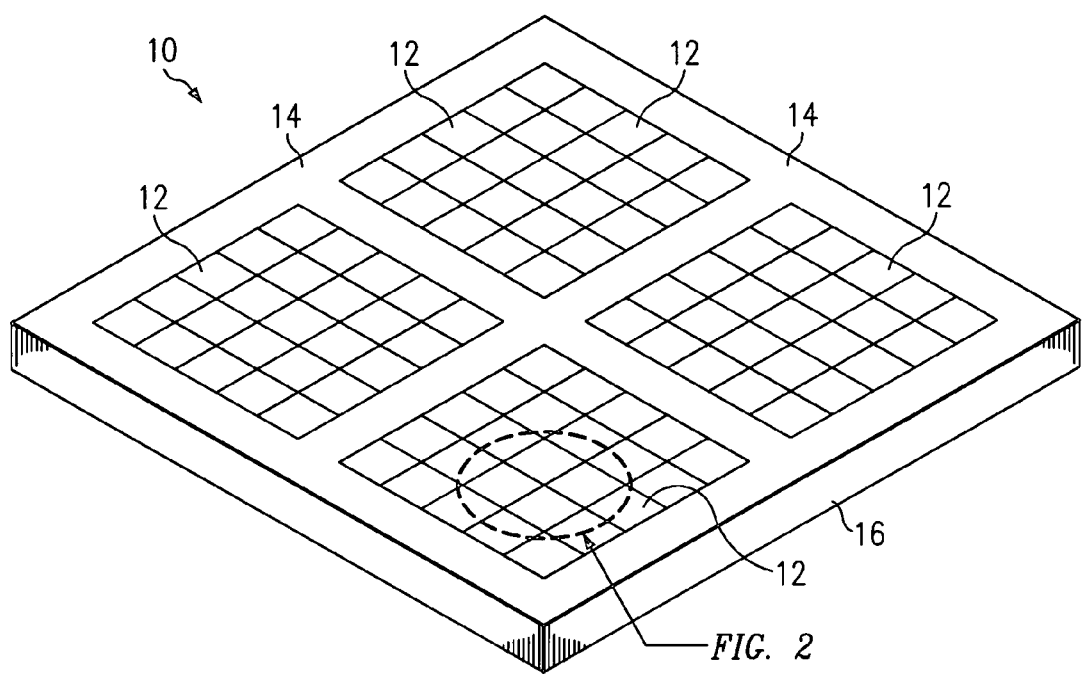
FIG. 1 illustrates an isometric view of a photomask that includes multiple cell arrays formed in a patterned layer according to the teachings of the present invention.

FIG. 1 illustrates an isometric view of photomask 10 including multiple cell arrays 12 formed in patterned layer 14. Photomask 10 includes patterned layer 14 formed on transparent substrate 16. In one embodiment, patterned layer 14 may be an opaque material, such as chrome, chromium nitride, a metallic oxy-carbo-nitride, e.g., MOCN where M is selected from the group consisting of chromium, cobalt iron, zinc, molybdenum, niobium, tantalum, titanium, tungsten, aluminum, magnesium and silicon, and any other suitable material that absorbs light with wavelengths between approximately 150 nanometers (nm) and approximately 450 nm. In an alternative embodiment, patterned layer 14 may be a partially transmissive material, such as molybdenum silicide (MoSi), which has a transmissivity of approximately one percent to approximately thirty percent. Transparent substrate 16 may be synthetic quartz, fused silica, magnesium fluoride, calcium fluoride, or any other suitable material that transmits approximately ninety-nine percent of incident light having a wavelength between approximately 150 nm and approximately 450 nm.

Photomask 10 may be formed from a photomask blank using a standard lithography process. In the lithography process, described in more detail below, a data file including pattern information for cell arrays 12 may be generated from a circuit design pattern and the desired pattern may be imaged into a resist layer of the photomask blank using a laser or electron beam lithography tool. In one embodiment, a laser lithography tool uses an Argon-Ion laser that emits light having a wavelength of approximately 364 nm. In alternative embodiments, the laser lithography tool uses lasers emitting light at wavelengths from approximately 150 nm to approximately 300 nm. Photomask 10 may be fabricated by developing the exposed areas of the resist layer to create a pattern, etching the portions of patterned layer 14 not covered by resist, and removing the undeveloped resist to create patterned layer 14 over transparent substrate 16.

Figure 2:
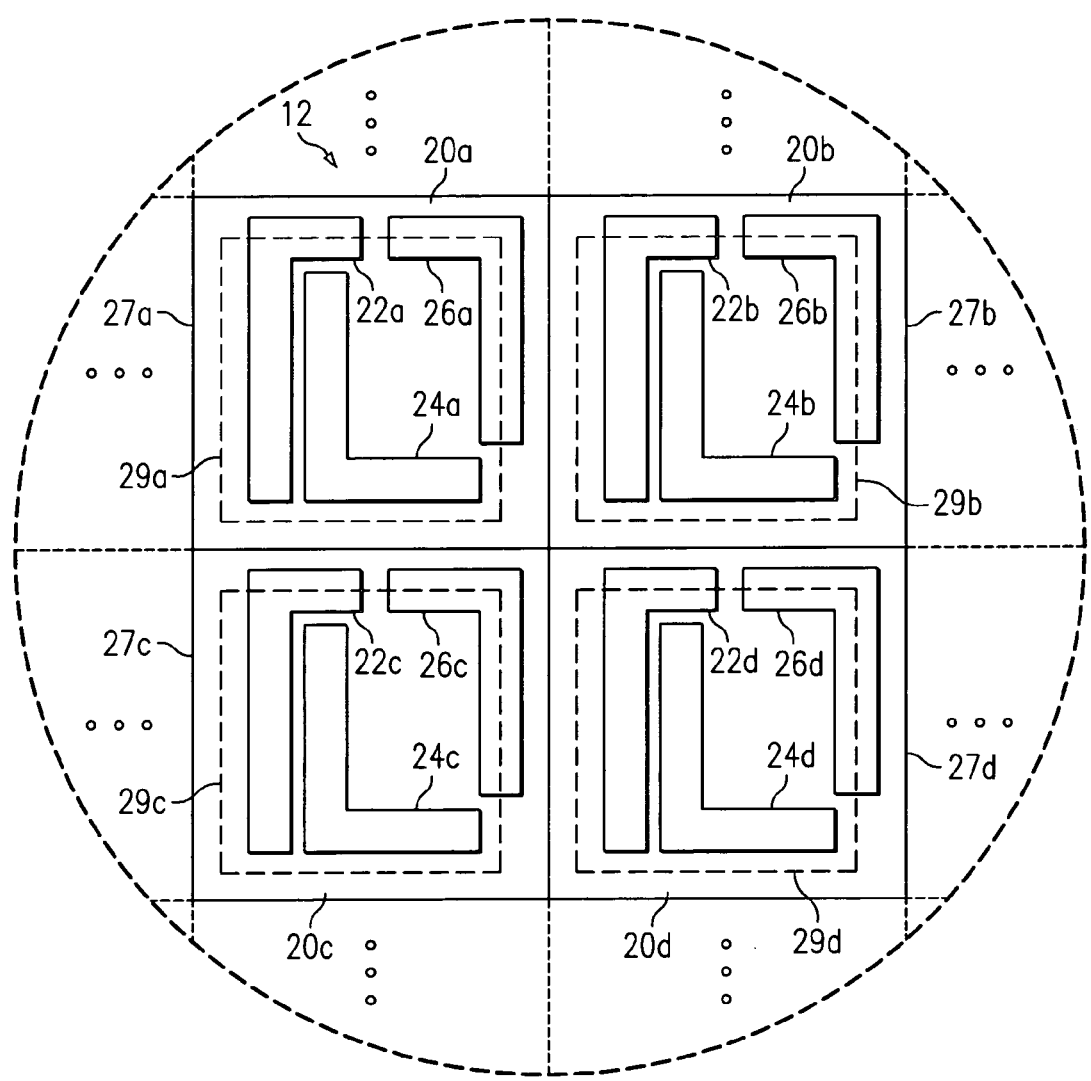
FIG. 2 illustrates an enlarged view with portions broken away of one of the cell arrays formed in the patterned layer of the photomask.

FIG. 2 illustrates an enlarged view with portions broken away of cell array 12 formed in patterned layer 14 of photomask 10. Cell array 12 includes cells 20a through 20d (generally referred to as cells 20) that each contain features 22, 24 and 26 (generally referred to as features 22). Cell array 12 may be a part of an IC on a microprocessor, a digital signal processor (DSP), a memory chip, such as a Static Random Access Memory (SRAM) or Dynamic Random Access (DRAM) chip, a field programmable gate array (FPGA) or any other suitable device that may include an array of substantially identical cells.

Cells 20a through 20d are respectively framed by cell boundaries 27a through 27d (generally referred to as cell boundaries 27). Proximity boundaries 29a through 29d (generally referred to as proximity boundaries 29) are respectively located inside of cell boundaries 27a through 27d and define an area within cells 20 in which optical proximity effects on features 22 only occur from influences within cells 20. For example, feature 24a is located entirely within cell 20a and therefore, only features 22a and 26a influence the size and shape of feature 24a. In contrast, features 22a and 26a overlap proximity boundary 29a in cell 20a. The edges of features 22a and 26a that are located outside of proximity boundary 29a, therefore, may be influenced by features located outside of cell boundary 27a, while the edges of features 22a and 26a that are located inside of proximity boundary 29a may only be influenced by features 22 located in cell 20a. The distance between cell boundaries 27 and proximity boundaries 29 may be dependent on the lithography tool or processing technique used to fabricate photomask 10. In one-embodiment, the distance may be between approximately one micron to approximately ten microns.

Optical proximity effects caused by neighboring features may change the dimensions of features 22 when they are printed into a resist layer of a photomask blank. In order to avoid changes to the dimensions of features 22, optical proximity correction (OPC) may be used to modify the dimensions of certain features within a photomask pattern file to compensate for changes in feature size and/or shape that occur during pattern transfer from the pattern file to the resist layer of the photomask blank. OPC may be any polygon that is added to features 22 in the pattern file so that features 22 have the correct dimensions on photomask 10.

For example, optical proximity effects may cause corner rounding on features that have dimensions near the resolution limit of optics within the associated lithography tool. OPC features, such as serifs, may be added to the corners of smaller features, such as contacts, to help square the corners of the features. Other optical proximity effects may cause printed features in a resist layer to be smaller than design features in an associated photomask pattern file. If there is extra space between the affected feature and any neighboring features in the pattern file, the dimensions of the affected feature may be increased in the pattern file to produce printed features in the resist layer with the desired dimensions.

As shown in FIG. 2, each instance of cell 20 includes features 22. In the illustrated embodiment, features 24a through 24d are located completely within proximity boundaries 29a through 29d respectively drawn in cells 20a through 20d and any optical proximity effects on features 24 will occur only as a result of features 22 and 26 that are located within cell boundaries 27. Any OPC added to features 24, therefore, may be substantially identical and may be added to each instance of cells 20. In contrast, features 22a through 22d and 26a through 26d respectively overlap proximity boundaries 29a through 29d in cells 20a through 20d. Features 22 and 26, therefore, may be simultaneously influenced by features 24 located in cells 20 and peripheral features outside of cell boundaries 27.

OPC added to the edges of features 22 and 26 located inside of proximity boundaries 29 in cells 20 will occur in all instances of cells 20, while OPC added to the edges of features 22 and 26 that lie outside of proximity boundaries 29 in cells 20, also known as cell-to-cell OPC, may not need to be included in all instances of cells 20. For example, optical proximity effects on feature 26a in cell 20a may be caused by feature 22b located in cell 20b. An instance of cell 20 that is located in the center of cell array 12 and surrounded by other instances of cell 20 may require cell-to-cell OPC for feature 26a. However, an instance of cell 20 that is located on the edge of cell array 12 may not require cell-to-cell OPC for feature 26a because peripheral features outside of cell array 12 may not be located close enough to cell boundary 27a to influence the dimensions of feature 26a. The cell-to-cell OPC, therefore, may not be directly added to all cells 20.

In one embodiment, photomask pattern files used by a lithography tool may be hierarchical. A hierarchical design is described in more detail in U.S. Pat. No. 5,885,734 issued to Pierrat et al. In a hierarchical design, OPC for features 22 located completely inside of proximity boundaries 29 in cells 20 (e.g., features 24a through 24d) is placed in the same level, and thus the same pattern file, as features 22. In contrast, cell-to-cell OPC added to features 22 that corrects cell-to-cell proximity effects (e.g., features 22a through 22d and features 26a through 26d) is unique to the location of cells 20 and may be placed in a different level of the design. For example, an instance of cell 20 located on the edge of cell array 12 may not require the same cell-to-cell OPC as an instance of cell 20 that is located in the center of cell array 12. In order to preserve the identical nature of cells 20, cell-to-cell OPC may be added one level of hierarchy up from the level containing features 22 in cells 20 and thus, may be placed in a separate photomask pattern file.

Figure 3A:
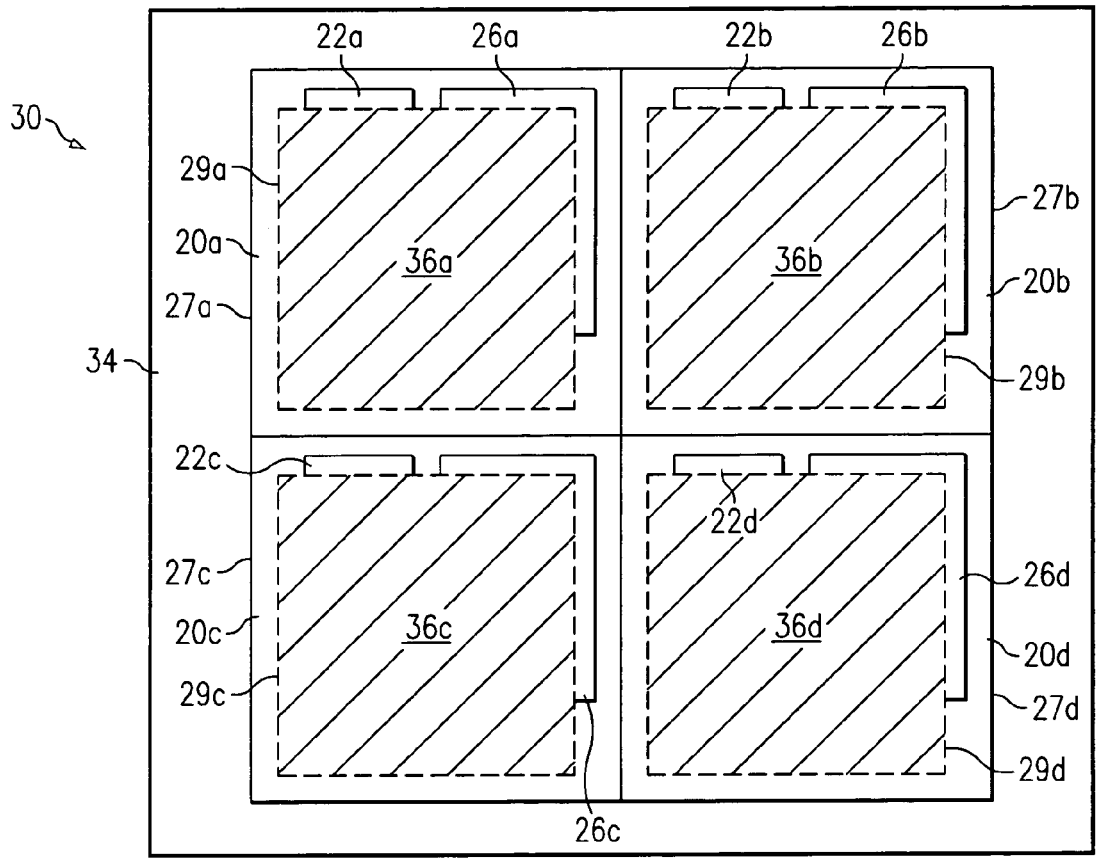
FIG. 3A illustrates one embodiment of a frame pattern file used to image a frame portion of the cell array into a resist layer of a photomask blank according to the teachings of the present invention.
Figure 3B:
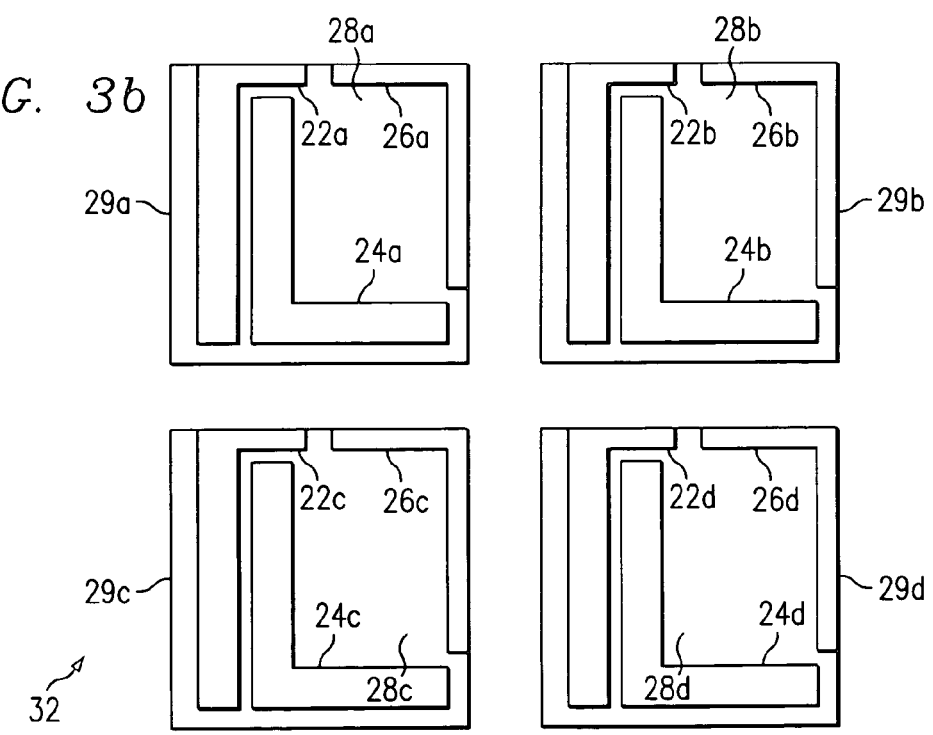
FIG. 3B illustrates one embodiment of a cell pattern file used to image a cell portion of the cell array into a resist layer of a photomask blank according to the teachings of the present invention.

FIG. 3A illustrates one embodiment of frame pattern file 30 and FIG. 3B illustrates one embodiment of cell pattern file 32, which define the size and position of features 22 and are used by a lithography tool to image cell array 12 into a resist layer of a photomask blank. Frame pattern file 30 includes frame 34 and blocking features 36a through 36d (generally referred to as blocking features 36). The position of blocking features 36 in frame pattern file 30 correspond to the area framed by proximity boundaries 29 within cells 20. Frame 34 may contain peripheral features such as alignment marks, identification marks or other features that are printed into the resist layer of the photomask blank during processing but are located outside of the area to be imaged onto the surface of a wafer. Blocking features 36 prevent the resist layer on the photomask blank corresponding to the positions of blocking features 36 in frame pattern file 30 from being exposed during printing of frame pattern file 30.

As shown in FIG. 3B, cell pattern file 32 includes reduced cells 28a through 28d (generally referred to as reduced cells 28) that respectively correspond to the area framed by proximity boundaries 29a through 29d of cells 20a through 20d in cell array 12. The boundaries of reduced cells 28 enclose the area in cells 20 in which optical proximity effects are caused only by features 22 located within cells 20.

As described above in reference to FIG. 2, cells 20 include features 22 and 26 that may be influenced by optical proximity effects caused by peripheral features located outside of cell boundaries 27. Cell-to-cell OPC added to features 22 and 26 in frame pattern file 30 may not be required in every instance of cell 20 since the need for cell-to-cell OPC depends on the local environment of cell 20. Adding cell-to-cell OPC to features 22 and 26, therefore, may destroy the identical nature of cells 20 and preclude using a step and repeat technique (described in detail below in reference to FIG. 5) for printing cell array 12 into the resist layer of the photomask blank. For example, feature 26a in cell 20a may require cell-to-cell OPC since feature 26a overlaps proximity boundary 29a. The edges of feature 26a located outside of proximity boundary 29a may be affected by feature 22b in cell 20b and thus, require cell-to-cell OPC. However, feature 26b in cell 20b may not require cell-to-cell OPC if it is located on the edge of cell array 12.

Since each instance of cells 20 may not require cell-to-cell OPC, any cell-to-cell OPC may be added to features 22 and 26 in a different hierarchical layer of the photomask design than features 22 and 26. As shown in FIG. 3A, the dimensions of cells 20 in frame pattern file 30 may be adjusted a uniform distance from cell boundaries 27. In one embodiment, the adjusted distance corresponds to proximity boundaries 29 located cells 20. The adjusted distance may also be equal to the maximum distance for a specific process in which neighboring features may have an influence on other features. For example, in the specific process one feature may influence another feature if the two are separated by approximately one micron to approximately ten microns.

As illustrated in FIG. 3A, portions of features 22 and 26 that are located between cell boundaries 27 and proximity boundaries 29 may include different cell-to-cell OPC and may be moved from cell pattern file 32 to frame pattern file 30. As illustrated in FIG. 3B, features 24 and the portions of features 22 and 26 that are located within reduced cells 28 may have substantially identical OPC and therefore may be included in cell pattern file 32.

In a hierarchical layout, frame pattern file 30 may be located at least one layer above cell pattern file 32 that includes reduced cells 28. Blocking features 36 may be placed in frame pattern file 30 to prevent the area of the resist corresponding to reduced cells 28 from being exposed during printing of frame pattern file 30. Although frame pattern file 30 may be large in area, the patterns located in frame 34 and in the area of cell array 12 contain a small number of design features. Frame pattern file 30, therefore, may be printed into the resist layer without adding a significant amount of processing or printing time.

Since each instance of reduced cell 28 in cell pattern file 32 includes features 22 and the associated OPC, a step and repeat technique may be used to print reduced cells 28 into the resist layer of the photomask blank. The step and repeat technique may increase the throughput of the lithography tool if the extra time needed to separately print each instance of reduced cell 28 is less than the amount of time needed to process and compile all of the patterns (e.g., frame 24 and features 22 located in cells 20) that form cell array 12 in patterned layer 14 of photomask 10.

Figure 4A:
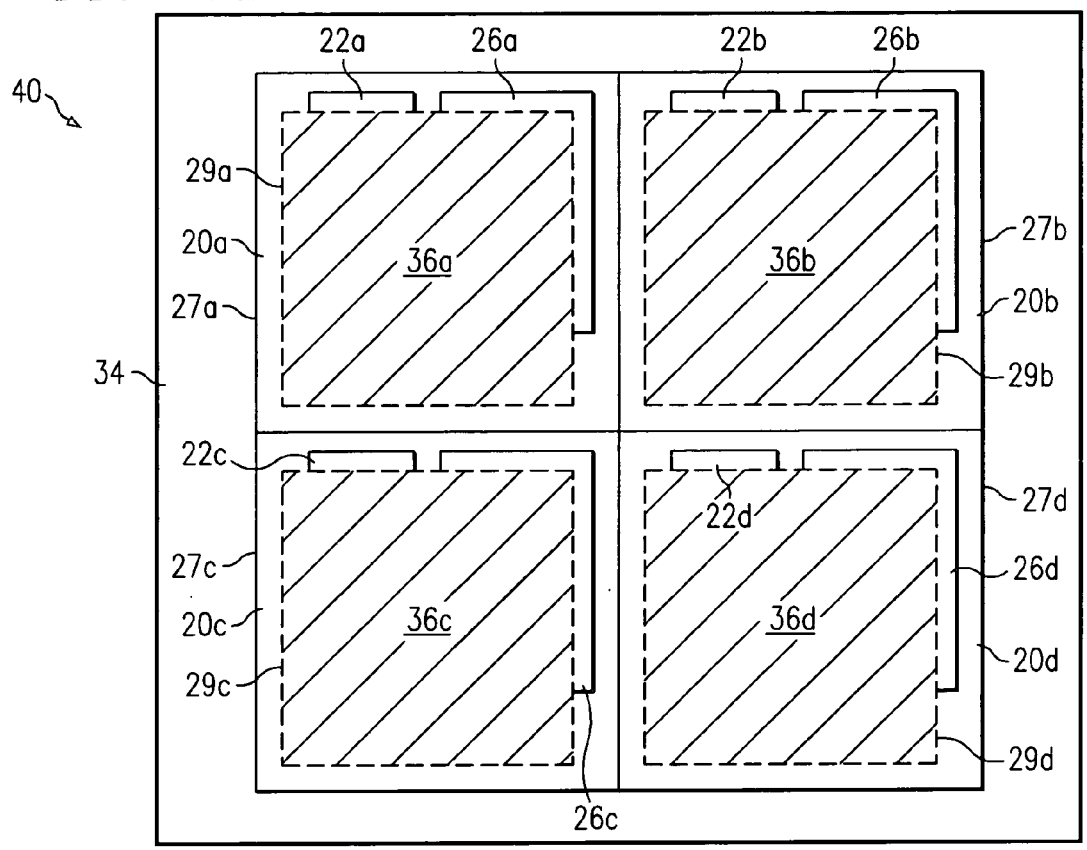
FIG. 4A illustrates an alternative embodiment of the frame pattern file used to image the frame portion of the cell array into the resist layer of the photomask blank.
Figure 4B:
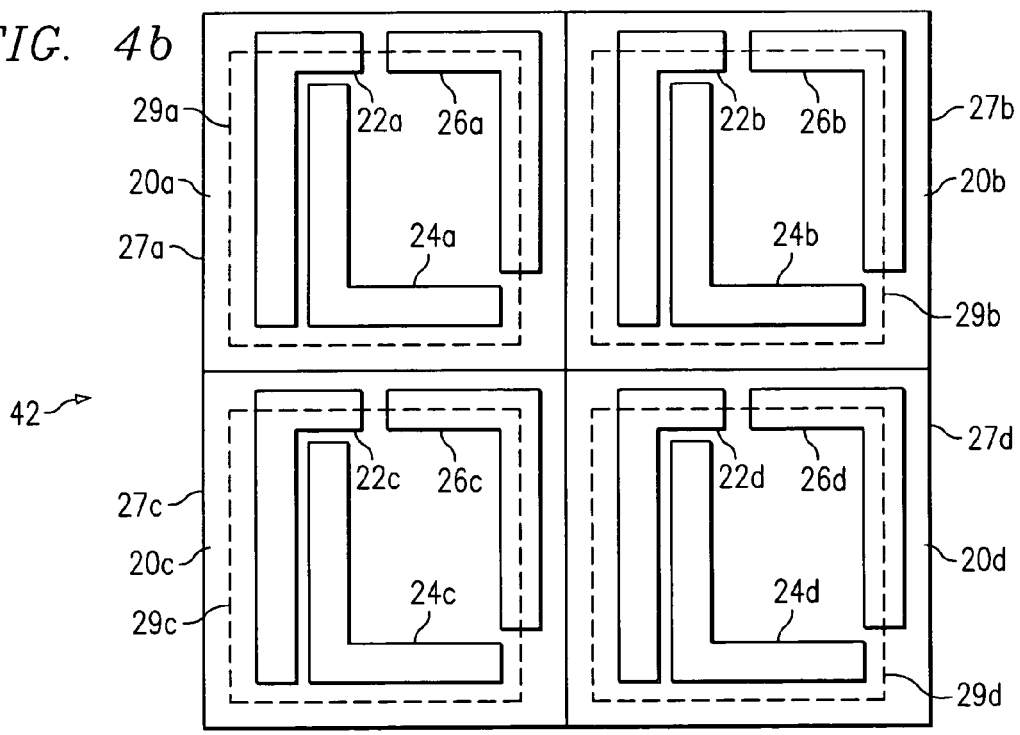
FIG. 4B illustrates an alternative embodiment of the cell pattern file used to image the cell portion of the cell array into the resist layer of the photomask blank.

FIG. 4A illustrates an alternative embodiment of frame pattern file 40 and FIG. 4B illustrates an alternative embodiment of cell pattern file 42, which are used by a lithography tool to image cell array 12 into a resist layer of a photomask blank. Frame pattern file 40 includes frame 34 and blocking features 36. As described in reference to FIG. 3A, blocking features 36 have dimensions that correspond to the area defined by proximity boundaries 29 located in cells 20. During printing of frame pattern file 40, portions of the resist layer corresponding in position to blocking features 36 are not exposed. Cell pattern file 42 includes multiple instances of cell 20 that form cell array 12.

As described above in reference to FIG. 2, features 22 and 26 include edges that are located outside of proximity boundaries 29. These edges of features 22 and 26 may be changed in size and/or shape by optical proximity effects caused by peripheral features located outside cell boundaries 27. As shown in FIG. 4A, the identical nature features 22 within cells 20 that form cell array 12 may be preserved by moving the portions of features 22 and 26 that are located outside of reduced cells 28 from cell pattern file 42 into frame pattern file 40. The addition of features 22 and 26 into frame pattern file 30 may increase the size of frame pattern file 30. However, the processing time for frame pattern file 20 may not increase by a significant amount since the peripheral features included in frame 34 are low density.

As illustrated in FIG. 4B, cell pattern file 42 includes features 22 that are located inside of cell boundaries 27. The portions of features 22 and 26 that are located between cell boundaries 27 and proximity boundaries 29 may remain in cell pattern file 42 since features 22 and 26 are substantially identical in each instance of cells 20. However, in order to preserve the identical nature of cells 20, any cell-to-cell OPC associated with the portions of features 22 that lie outside of proximity boundaries 29 is moved into frame pattern file 40. Since any cell-to-cell OPC associated with features 22 and 26 have been moved into frame pattern file 40, cell pattern file 42 may be used in a step and repeat process to image features 22 into the resist layer of the photomask blank.

FIGS. 5A through 5C illustrate a step and repeat technique for printing cell array 12 into a resist layer on a photomask blank by using frame pattern file 50 and cell pattern file 52 to create pattern 54 in the resist layer. Similar to frame pattern file 30 described in reference to FIG. 3A, frame pattern file 50 includes frame 34 and blocking features 36. In the illustrated embodiment, cell pattern file 52 includes multiple instances of cells 20 that are used form cell array 12 on photomask 10. In an alternative embodiment, cell pattern file 52 includes multiple instances of reduced cells 28 (as shown in FIG. 3B) that form cell array 12.

A laser writer, such as an ALTA laser writer manufactured and sold by Etec Systems, Inc., prints the patterns from frame pattern file 50 (illustrated in FIG. 5A) and cell pattern file 52 (illustrated in FIG. 5B) into the resist layer of a photomask blank in a series of horizontal stripes 56 and 58 to create pattern 54 (illustrated in FIG. 5C). The laser writer may include three subsystems: optics, a pattern delivery system, and an X-Y stage. The optics system may include a continuous wave argon-ion laser that emits a beam at approximately 364 nm. The single beam is split into thirty-two beams, commonly referred to as the brush, by a multi-plate beamsplitter. The brush is scanned in the Y-axis with a rotating polygonal mirror and the intensity of each beam in the brush is controlled in seventeen discrete steps ranging from fully off to fully on through the use of a thirty-two channel acousto-optic modulator (AOM). The brush is then focused onto the surface of photomask 10 with a reduction lens.

A photomask blank containing an undeveloped resist layer may be placed on the X-Y stage that can be translated in the X-Y plane. In order to create patterned layer 14 in photomask 10, the stage moves the photomask blank in the X-axis under the reduction lens in a continuous motion while the brush is scanned in the Y-axis, causing horizontal stripe 56 and/or horizontal stripe 58 to be patterned in the resist layer on the photomask blank. In one embodiment, the brush has a scan length of approximately 655 microns, which corresponds to the width of horizontal stripes 56 and 58.

After one of horizontal stripes 56 and/or horizontal stripes 58 is printed in the resist layer, the stage retraces in the stripe in the X-axis and is positioned at the start of another horizontal stripe. Each of horizontal stripes 56 and 58 is printed sequentially and the printing process is repeated until the entire pattern from frame pattern file 50 and/or cell pattern file 52 has been imaged in the resist layer. The printing time for each of horizontal stripes 56 and 58 is independent of the stage and brush motions. For example, the ALTA laser writer may print any length of horizontal stripes 56 and 58 in approximately six seconds.

The pattern delivery system may include a control computer, such as a personal computer (PC), a work station, a server, or any other suitable computing platform that may control the laser writer, a storage medium, a high-speed synchronous serial bus (SSB), a set of hardware rasterizers and thirty-two beamboards. When a plate is queued in the laser writer, the control computer translates frame pattern file 50 and cell pattern file 52 into ALTA Binary Format (ABF). The ABF data may be embodied in any type of medium including, but not limited to, hard drives, diskettes, CD-ROMs, DVD-ROMs, optical or magnetic media, field programmable arrays (FPGAs), embedded processors, or any other suitable media associated with the lithography tool. During printing, ABF data is compiled for one stripe (e.g., horizontal stripe 56) into a gray-scale bitmap, which is sent to the beamboards. The beamboards modulate the beam intensity of the brush during printing by controlling the AOM.

When a sufficient amount of data in horizontal stripe 56 has been processed by the rasterizers, the laser writer begins to print horizontal stripe 56 in the resist layer. As long as the time to process the data for each of stripes 56 and 58 is less than the stage motion time for the stripe being printed, the data volume has no influence on throughput. However, if the data volume for one of stripes 56 and 58 requires more processing time than the stage motion time for the particular stripe, the X-Y stage must wait for the data to be processed and throughput is adversely affected. The primary data processing bottleneck, therefore, is the SSB transfer rate.

In a conventional printing process, frame 34 and cell array 12 may be imaged into the resist layer of the photomask blank by creating a flat data pattern file that includes the patterns in frame pattern file 50 and the patterns in cell pattern file 52. In this example, the laser writer simultaneously processes the total data volume of cell array 12 and the additional data volume of frame 34 for each horizontal stripe to be imaged into the resist layer of a photomask blank.

Since features 22 in cells 20 may include OPC, the size of cell pattern file 52 may be very large. As described above, the size of the data file processed by the laser writer has no effect on printing time for horizontal stripes 56 and 58. However, the overall throughput of the system may decrease because a larger data file requires more processing time. In order to minimize the time required to image cell array 12 and frame 34 into the resist layer, the overall pattern to be imaged may be divided into frame pattern file 50 and cell pattern file 52. In this example, the patterns in frame pattern file 50 and cell pattern file 52 are individually imaged into the resist layer of the photomask blank.

Cell array 12 may contain cells 20 that include features 22, which increase the size and processing time of cell pattern file 52. Thus, the throughput of the lithography tool may be decreased since the processing time for cell pattern file 52 is added to the processing time for frame pattern file 50. Processing time for cells 20 may be reduced by using a step and repeat technique for processing and printing cell array 12 into the resist layer.

In a step and repeat technique, the data for an instance of cell 20 in cell pattern file 52 may be defined once and contain references to the location of each instance of cells 20. The data for the one instance of cell 20 may be stored in the media associated with the laser writer. During printing, the processed data is reused for cells 20a through 20d. For example, the laser writer may first image cell 20a into the resist layer. The X-Y stage in the laser writer moves the photomask blank in the X-axis under the reduction lens in a continuous motion while the brush is scanned in the Y-axis to image horizontal stripe 58a in the resist layer. The stage then retraces horizontal stripe 58a and continues to image horizontal stripes into the resist layer until all of cell 20a has been imaged into the resist layer. Once the laser writer completes cell 20a, the laser writer repeats the imaging process for each of horizontal stripes 58b through 58d in respective cells 20b through 20d until cell array 12 has been printed in the resist layer of the photomask blank.

By using frame pattern file 50 and cell pattern file 52, the stage time for printing the patterns into the resist layer is doubled but the step and repeat technique may reduce the processing time significantly. For example, a laser writer may require approximately twenty hours to print a twenty gigabyte mask pattern file into the resist layer. A one gigabyte file, however, may only require one hour of printing time. If a step and repeat technique reduced the size of cell pattern file 52 to less than one gigabyte, the data processing time would be reduced but the print time would double. In this example, the overall print time for the step and repeat technique would be less than the print time for the conventional technique and the step and repeat technique would be justified.

As shown in FIG. 2, some of cells 20 may contain features 22 and 26 that overlap proximity boundaries. As described above, optical proximity effects from peripheral features outside proximity boundaries 29 may create a need for cell-to-cell OPC on features 22. If cells 20 contain cell-to-cell OPC, the step and repeat technique may not be used because cells 20 located on the outside of cell array 12 may not contain the same OPC as cells 20 in the center of cell array 12.

In order to utilize the step and repeat technique, cell-to-cell OPC may be moved from cell pattern file 52 into frame pattern file 50. If the cell-to-cell OPC is removed from cells 20, the patterns in frame pattern file 50 may be imaged into the resist layer using a conventional technique and the patterns in cell pattern file 52 may be imaged into the resist layer using a step and repeat technique. In a conventional technique, a lithography tool processes the data in frame pattern file 50 and sequentially images horizontal stripes 56 into the resist layer of the photomask blank until frame 34 and the portions of features 22 and 26, including any associated cell-to-cell OPC, that lie between cell boundaries 27 and proximity boundaries 29 have been printed on photomask 10.

In order to reduce processing time and increase throughput of the lithography tool, cell pattern file 52, including features 22 that are located inside of proximity boundaries 29, may be printed into the resist layer of a photomask blank using a step and repeat technique. In one embodiment, illustrated in FIGS. 3A and 3B, the edges of cells 20 are moved a uniform distance toward the center to form reduced cells 28. The portions of features 22 and 26, and the associated cell-to-cell OPC located between cell boundaries 27 and proximity boundaries 29 are moved from cell pattern file 52 into frame pattern file 50. The lithography tool processes the data for one instance of reduced cell 28 and sequentially images horizontal stripes 58a in cell 20a until cell 20a is imaged into the resist layer. The lithography tool then repeats the imaging process for each of horizontal stripes 58b through 58d respectively located in cells 20b through 20d until each instance of reduced cell 28 is printed in the resist layer.

In an alternative embodiment, illustrated in FIGS. 4A and 4B, the portions of features 22 and 26, and the associated cell-to-cell OPC that are located outside of proximity boundaries 29 are moved from cell pattern file 52 into frame pattern file 50. Similar to the method used to print reduced cells 28 into the resist layer, the lithography tool processes one instance of cell 20 and sequentially images horizontal stripes 58a through 58d until each instance of cell 20 is printed.

In one embodiment, frame pattern file 50 may be imaged into the resist layer of the photomask blank before cell pattern file 52. In an alternative embodiment, cell pattern file 52 may be imaged into the resist layer before frame pattern 50. In either of the embodiments described above, the patterns from frame pattern file 50 and cell pattern file 52 form pattern 54 in the resist layer of the photomask blank. Photomask 10 is completed by developing the resist layer and etching areas of patterned layer 14 corresponding to the exposed portions of the resist layer.

Although the present invention has been described in detail, it should be understood that various changes, substitutions, and alterations can be made without departing from the spirit and scope of the invention as defined by the appended claims.

What is claimed is:

1. A method for reducing exposure times of high density patterns on a photomask, comprising:
   moving at least a portion of a selected feature from a first pattern file to a second pattern file, the at least a portion of the selected feature located in a cell between a first boundary and a second boundary;
   wherein moving at least a portion of the selected feature includes reducing dimensions of the cell in the first pattern file to form a reduced cell that excludes the at least a portion of the selected feature; and
   exposing a resist layer of a photomask blank with the first pattern file by using a step and repeat technique.

2. The method of claim 1, further comprising:
   exposing the resist layer with the second pattern file; and
   developing the resist layer to form the cell and the selected feature.

3. The method of claim 1, wherein the step and repeat technique comprises:
   processing data associated with the cell from the first pattern file;
   dividing the cell into a plurality of sections; and
   individually exposing the sections in the resist layer until the cell is completely formed in the resist layer.

4. The method of claim 1, further comprising the cell including a plurality of features located inside of the second boundary.

5. The method of claim 1, wherein moving at least a portion of the selected feature comprises
   inserting a blocking feature into the second pattern file, the blocking feature corresponding in size to the reduced cell in the first pattern file.

6. The method of claim 1, wherein the reducing comprises moving the first boundary to correspond with the second boundary.

7. The method of claim 5, further comprising the blocking feature operable to prevent the resist layer from being exposed in an area inside the second boundary.

8. The method of claim 1, further comprising the second boundary located inside of the first boundary, the first and second boundaries separated by approximately one micron to approximately ten microns.

9. The method of claim 1, further comprising the selected feature including a design feature and an optical proximity correction associated with the design feature.

10. A method for fabricating a photomask, comprising:
providing a photomask blank that includes a resist layer;
moving a plurality of optical proximity correction (OPC) features from a first pattern file to a second pattern file, the OPC features respectively located between an outer boundary and an inner boundary for a plurality of cells in an array;
exposing the resist layer of the photomask blank with the first pattern file by using a step and repeat technique;
exposing the resist layer with the second pattern file; and
developing the resist layer to form the array and the OPC features.

11. The method of claim 10, wherein the step and repeat technique comprises:
processing data associated with a selected cell from the first pattern file;
dividing the selected cell into a plurality of sections;
sequentially exposing the sections from the selected cell with the first pattern file; and
repeating the processing, dividing and exposing steps for each of the cells in the array until the cells are exposed in the resist layer.

12. The method of claim 10, wherein moving the OPC features comprises:
reducing dimensions of the cells in the first pattern file to form respective reduced cells that exclude the OPC features; and
inserting a plurality of blocking features into the second pattern file, the blocking features corresponding in size to the reduced cells and preventing respective portions of the resist layer from being exposed inside the inner boundary.

13. The method of claim 12, wherein reducing the dimensions of the cells comprises moving the outer boundary to correspond with the inner boundary.

14. The method of claim 10, wherein moving the OPC features comprises replacing the OPC features in the first pattern file with a plurality of blocking features.

15. The method of claim 10, further comprising the outer and inner boundaries separated by approximately one micron to approximately ten microns.

16. The method of claim 10, further comprising moving a plurality of design features associated with the OPC features from the first pattern file to the second pattern file.

17. A method for reducing exposure time of high density patterns on a photomask, comprising:
moving at least a portion of a selected feature from a first pattern file to a second pattern file, the at least a portion of the selected feature located in a cell between an inner boundary and an outer boundary;
inserting a blocking feature into the second pattern file, the blocking feature defined by the inner boundary of the cell in the first pattern file; and
exposing a resist layer of a photomask blank with the first pattern file by using a step and repeat technique.

18. The method of claim 17, further comprising:
exposing the resist layer with the second pattern file, the blocking feature operable to prevent respective portions of the resist layer from being exposed inside the inner boundary; and
developing the resist layer to form the cell and the selected feature.

19. The method of claim 18, wherein exposing the resist layer comprises printing the cell and the selected feature in the resist layer using a laser writer.

20. The method of claim 17, further comprising:
the selected feature including a first portion located between the inner boundary and the outer boundary and a second portion located inside the inner boundary; and
moving the first portion of the selected feature from the first pattern file to the second pattern file.

21. The method of claim 17, further comprising the selected feature including a design feature and an optical proximity correction associated with the design feature.

22. The method of claim 17, further comprising the outer and inner boundaries separated by approximately one micron to approximately ten microns.

23. The method of claim 17, further comprising the second pattern file including at least one peripheral feature.

* * * * *